(12) United States Patent
Song et al.

(10) Patent No.: US 9,196,660 B2
(45) Date of Patent: Nov. 24, 2015

(54) ARRAY SUBSTRATE AND FABRICATION METHOD THEREOF, DISPLAY DEVICE

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/097,477

(22) Filed: Dec. 5, 2013

(65) Prior Publication Data
US 2014/0159007 A1    Jun. 12, 2014

(30) Foreign Application Priority Data

Dec. 12, 2012 (CN) .......................... 2012 1 0537562

(51) Int. Cl.
*H01L 29/20* (2006.01)
*H01L 33/00* (2010.01)
(Continued)

(52) U.S. Cl.
CPC .......... *H01L 27/322* (2013.01); *H01L 27/3206* (2013.01); *H01L 27/3213* (2013.01); *H01L 51/5265* (2013.01); *H01L 27/3262* (2013.01)

(58) Field of Classification Search
CPC ... H01L 27/32; H01L 27/322; H01L 27/3206; H01L 27/3213; H01L 27/3244; H01L 27/3248
USPC ............... 257/40, 89, 98, 113, 114, 118, 124, 257/144, 146, 152, 163, E51.022, E51.005
See application file for complete search history.

(56) References Cited

U.S. PATENT DOCUMENTS

2005/0280364 A1    12/2005 Omura et al.
2006/0221276 A1    10/2006 Masumoto et al.
(Continued)

FOREIGN PATENT DOCUMENTS

JP    2009-259731 A    11/2009
JP    2010-010020 A    1/2010
(Continued)

OTHER PUBLICATIONS

Korean Office Action dated Dec. 18, 2014; Appln. No. 10-2013-0153034.

(Continued)

*Primary Examiner* — Kyoung Lee
*Assistant Examiner* — Joannie A Garcia
(74) *Attorney, Agent, or Firm* — Ladas & Parry LLP

(57) ABSTRACT

Embodiments of the invention disclose an array substrate and a fabrication method thereof, and a display device. The array substrate comprises a plurality of pixel units disposed on a base substrate. Each pixel unit comprises a thin-film transistor region and a display region. A thin-film transistor structure is formed in the thin-film transistor region, and an organic light-emitting diode. The organic light-emitting diode comprises a transparent first electrode, a light-emitting layer, and a second electrode for reflecting light that are sequentially formed. A transflective layer is formed in the display region. A color filter film is formed in the display region and is disposed between the second electrode of the organic light-emitting diode and the transflective layer. The second electrode of the organic light-emitting diode and the transflective layer form a microcavity structure. The color filter films in the pixel units of different colors have different thicknesses.

10 Claims, 4 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 2009/0108743 A1* | 4/2009 | Kobayashi | 313/504 |
| 2009/0212696 A1 | 8/2009 | Terao | |
| 2009/0251051 A1 | 10/2009 | Hwang et al. | |
| 2009/0261716 A1 | 10/2009 | Choi et al. | |
| 2010/0052524 A1* | 3/2010 | Kinoshita | H01L 51/5265 313/504 |
| 2010/0059754 A1 | 3/2010 | Lee et al. | |
| 2010/0084968 A1* | 4/2010 | Watanabe et al. | 313/504 |
| 2011/0127533 A1 | 6/2011 | Chung et al. | |

FOREIGN PATENT DOCUMENTS

| | | |
|---|---|---|
| JP | 2012-018868 A | 1/2012 |
| KR | 20060046476 A | 5/2006 |
| KR | 20080047782 A | 5/2008 |
| KR | 20090092698 A | 9/2009 |

OTHER PUBLICATIONS

Extended European Search Report dated Jul. 3, 2014; Appln. No. 13195595.7-1555.

USPTO RR dated Dec. 15, 2014 in connection with U.S. Appl. No. 14/100,741.

USPTO NFOA dated May 8, 2015 in connection with U.S. Appl. No. 14/100,741.

First Chinese Office Action dated Oct. 10, 2014; Appln. No. 201210537743.3.

Second Chinese Office Action dated Apr. 10, 2015; Appln. No. 201210537743.3.

Extended European Search Report dated Mar. 13, 2014; Appln. No. 13196459.5-1555.

Korean Notice of Allowance Appln. No. 10-2013-0153034; Dated Aug. 20, 2015.

Korean Rejection Decision Appln. No. 10-2013-0153034; Dated Jun. 24, 2015.

USPTO FDA U.S. Appl. No. 14/100,741: Dated Aug. 13, 2010.

* cited by examiner

ARRAY SUBSTRATE AND FABRICATION METHOD THEREOF, DISPLAY DEVICE

TECHNICAL FIELD

Embodiments of the invention relate to an array substrate and a fabrication method thereof, and a display device.

BACKGROUND

Organic Light-Emitting Diode (OLED) has the advantages of simple process, low cost, capable of adjusting color of the emitted light in the visible region, easy for mass production, good flexibility and the like, and thus an OLED display device using the OLED is regarded as one of the most promising display technologies in the future. White OLED (WOLED) has a power efficiency over 60 lm/W and a lifetime of 20,000 hours or more, which greatly promotes the development of the WOLED display device.

FIG. 1(a) is a schematic diagram illustrating a conventional WOLED without a microcavity structure. As illustrated in FIG. 1(a), the WOLED adopts an organic light-emitting layer 102 formed by light-emitting materials of three primary colors of red, green and blue, so that the organic light-emitting layer 102 emits white light. The organic light-emitting layer 102 is disposed between a cathode 101 and an anode 103, and the white light emitted from the light-emitting layer 102 exits on the anode side after reflected by the cathode 101.

In order to improve light extraction efficiency of the WOLED and increase brightness of the WOLED display device, a transflective layer 103' is provided on the anode side, so as to form a microcavity structure between the cathode 101 and the transflective layer 103', as shown in FIG. 1(b). The microcavity structure is a structure with a thickness of micrometers formed between the reflecting layer and the transflective layer. The microcavity structure enhances the intensity of light based on the following principle. Light from the light-emitting layer is repeatedly reflected between the reflecting layer and the transflective layer, light with particular wavelength among the light ultimately emitted from the transflective layer will be enhanced due to the resonance effect, and the wavelength of the enhanced light is relevant to the thickness of the microcavity. In the WOLED display device, different pixel units are used to emit light of different colors, thus the microcavities in different pixel units should have different thicknesses so that light of different wavelengths can be enhanced in the different pixel units.

FIG. 2 is a structural schematic diagram illustrating an array substrate of the conventional WOLED display device with the microcavity structure, and FIG. 3 is a structural schematic diagram illustrating another array substrate of the conventional WOLED display device with the microcavity structure. As shown in FIGS. 2 and 3, a color filter film is disposed outside the microcavity structure, color filter films of different colors belong to different pixel units, and microcavity structures corresponding to the color filter films of different colors have different thicknesses.

FIG. 4 is a schematic diagram illustrating a comparison between a brightness of a WOLED with the microcavity structure and a brightness of a WOLED without the microcavity structure, wherein the dotted line corresponds to the brightness of the WOLED without the microcavity structure, and the solid line corresponds to the brightness of the WOLED with the microcavity structure. As illustrated in FIG. 4, by using the microcavity structure, the brightness of the blue light is increased by about 1.6 times, the brightness of the green light is increased by 2.5 times, and the brightness of the red light is increased by about 2.2 times.

Although the conventional microcavity structure enhances the intensity of the light, it can be seen from FIGS. 2 and 3 that the conventional microcavity structures have relatively complex hierarchy structures, it is required that the microcavity structures in the regions corresponding to the color filter films of different colors to have different thicknesses, and thus the fabrication process is relatively complex.

SUMMARY

According to one aspect of the invention, there is provided an array substrate. The array substrate comprises a plurality of pixel units disposed on a base substrate. Each pixel unit comprises a thin-film transistor region and a display region other than the thin-film transistor region. A thin-film transistor structure is formed in the thin-film transistor region, and an organic light-emitting diode driven by the thin-film transistor structure is disposed in the display region. The organic light-emitting diode comprises a transparent first electrode, a light-emitting layer, and a second electrode for reflecting light that are sequentially formed in a direction away from the base substrate. A transflective layer is formed in the display region. A color filter film is formed in the display region and is disposed between the second electrode of the organic light-emitting diode and the transflective layer. The second electrode of the organic light-emitting diode and the transflective layer form a microcavity structure. The color filter films in the pixel units of different colors have different thicknesses.

For example, the thin-film transistor structure comprises: a first gate electrode and a second gate electrode formed on the base substrate; a gate insulating layer formed on the first gate electrode and the second gate electrode; a first active layer and a second active layer formed on the gate insulating layer; an insulating layer formed on the first active layer and the second active layer; a first source electrode and a first drain electrode formed on the insulating layer and corresponding to the first active layer, and a second source electrode and a second drain electrode formed on the insulating layer and corresponding to the second active layer. The first gate electrode, the gate insulating layer, the first active layer, the insulating layer, the first source electrode and the first drain electrode form a switching thin-film transistor. The second gate electrode, the gate insulating layer, the second active layer, the insulating layer, the second source electrode and the second drain electrode form a driving thin-film transistor. The first drain electrode is connected to the second gate electrode, and the second drain electrode of the driving thin-film transistor is connected to the first electrode of the organic light-emitting diode.

For example, a passivation layer is formed on the thin-film transistor structure, and the passivation layer is further formed in the display region, the organic light-emitting diode is formed above the passivation layer, and the first electrode is connected to the second drain electrode through a via hole of the passivation layer.

For example, the insulating layer is further formed in the display region, and the transflective layer is formed between the insulating layer and the passivation layer.

For example, the color filter film is formed on the passivation layer and the first electrode of the organic light-emitting diode is disposed on the color filter film.

For example, a resin layer is further formed on the color filter film, the first electrode of the organic light-emitting diode is disposed on the resin layer, and the first electrode is connected to the second drain electrode through a via hole extending through the resin layer and the passivation layer.

For example, a portion of the transflective layer is formed below the first source electrode, the first drain electrode, the second source electrode and the second drain electrode of the thin-film transistor structure, and a pattern of the portion of the transflective layer is same as patterns of the first source electrode, the first drain electrode, the second source electrode and the second drain electrode.

For example, the pixel unit further comprises a pixel define layer disposed on the first electrode.

For example, the transflective layer is formed of any one of silver, aluminum, molybdenum, copper, titanium and chromium, or an alloy of two or more of the foregoing metals, and the transflective layer has a transmittance of 5%~95%.

For example, the transflective layer has a thickness of 10 Å~200 Å.

For example, the color filter film has a thickness of 1000 Å~40000 Å.

For example, the color filter films in the pixel units of different colors are red, green and blue; or red, green, blue and yellow; or red, green, blue and white.

For example, the first electrode is an anode, and the second electrode is a cathode.

For example, the first electrode is a cathode, and the second electrode is an anode.

For example, the second electrode is made of a reflective material, or the second electrode is coated with a reflecting layer.

According to another aspect of the invention, there is provided a display device. The display device comprises the array substrate as described above.

According to yet another aspect of the invention, there is provided an array substrate fabrication method. The array substrate comprises a plurality of pixel units disposed on a base substrate, and each pixel unit comprises a thin-film transistor region and a display region other than the thin-film transistor region. The method comprises: forming a thin-film transistor structure, a transflective layer and a passivation layer on the base substrate; forming a color filter film in the display region of each pixel unit, so that the color filter films in the pixel units of different colors have different thicknesses; and forming an organic light-emitting diode in the display region of each pixel unit so that the color filter film is disposed between the organic light-emitting diode and the transflective layer.

For example, forming the thin-film transistor structure, the transflective layer and the passivation layer on the base substrate comprises: forming gate electrodes, a gate insulating layer, active layers, an insulating layer and a via hole of the insulating layer on the base substrate; forming a transflective film and a source-drain metal film, and forming a transflective layer and source and drain electrodes of thin-film transistor structure by a patterning process; and forming a passivation layer.

For example, forming the color filter film in the display region of each pixel unit comprises: forming the color filter films in the pixel units of different colors by multiple patterning processes and each patterning process forms the color filter film in the pixel unit of one color, so that the color filter films in the pixel units of different colors have different thicknesses.

For example, forming the organic light-emitting diode in the display region of each pixel unit comprises: forming a via hole of the passivation layer by a patterning process; forming a transparent conductive film and forming a first electrode of the organic light-emitting diode by a patterning process on the transparent conductive film, so that the first electrode is connected to the thin-film transistor structure through the via hole; forming an insulating film and forming a pixel define layer by a patterning process on the insulating film, so that the organic light-emitting diode to be formed is defined in the display region; forming an organic light-emitting layer and forming a second electrode for reflecting light, so that the organic light-emitting diode is formed.

For example, after forming the color filter film and before forming the organic light-emitting diode, the method further comprises forming a resin layer.

For example, forming the organic light-emitting diode in the display region of each pixel unit comprises: forming a via hole extending through the passivation layer and the resin layer by a patterning process; forming a transparent conductive film and forming a first electrode of the organic light-emitting diode by a patterning process on the transparent conductive film, so that the first electrode is connected to the thin-film transistor structure through the via hole; forming an insulating film and forming a pixel define layer by a patterning process on the insulating film, so that the organic light-emitting diode to be formed is defined in the display region; forming an organic light-emitting layer and forming a second electrode for reflecting light, so that the organic light-emitting diode is formed.

For example, the transflective layer is formed of any one of silver, aluminum, molybdenum, copper, titanium and chromium, or an alloy of two or more of the foregoing metals, and the transflective layer has a transmittance of 5%~95%.

For example, the transflective layer has a thickness of 10 Å~200 Å.

For example, the color filter film has a thickness of 1000 Å~40000 Å.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
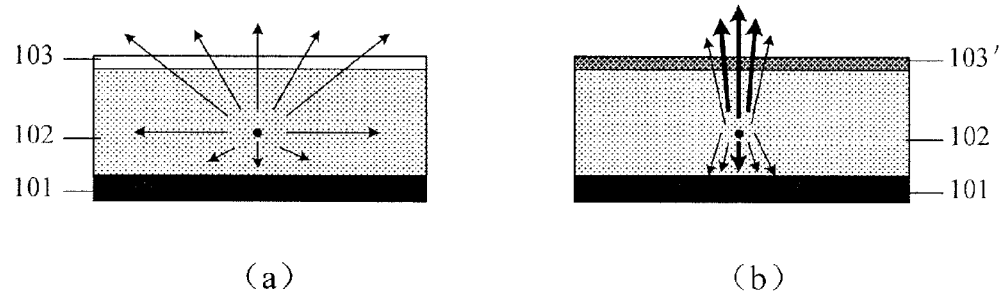
FIG. 1(a) is a schematic diagram illustrating a conventional WOLED without a microcavity structure.
FIG. 1(b) is a schematic diagram illustrating a conventional WOLED with a microcavity structure.
Figure 2:
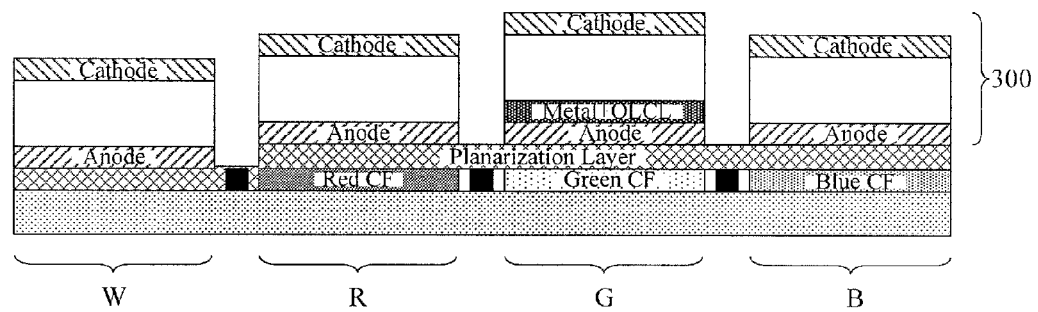
FIG. 2 is a structural schematic diagram illustrating an array substrate of a conventional WOLED display device with a microcavity structure.
Figure 3:
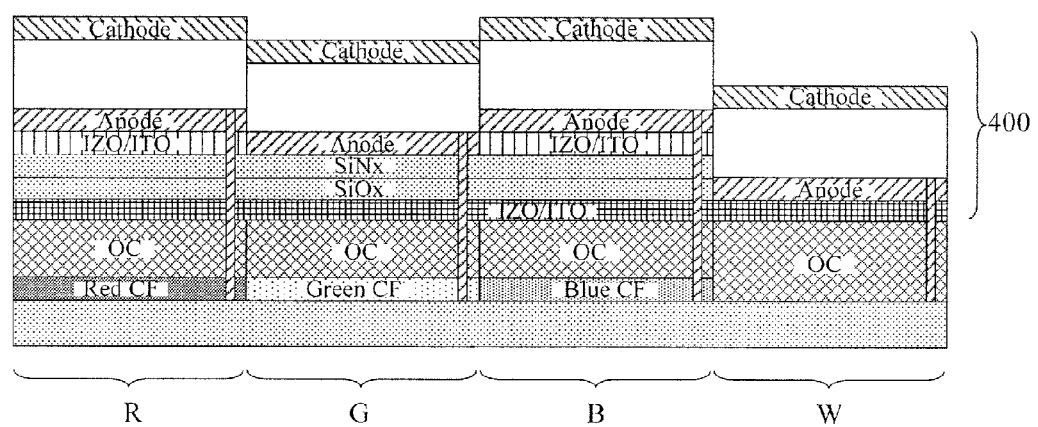
FIG. 3 is a structural schematic diagram illustrating another array substrate of a conventional WOLED display device with a microcavity structure.
Figure 4:
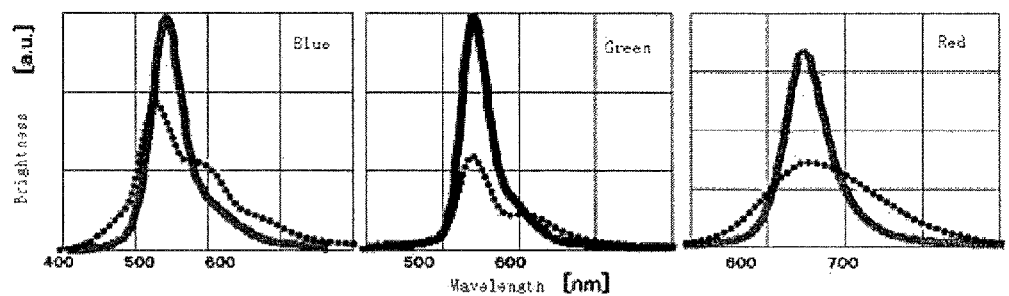
FIG. 4 is a schematic diagram illustrating a comparison between a brightness of a WOLED with a microcavity structure and a brightness of a WOLED without a microcavity structure.
Figure 5:
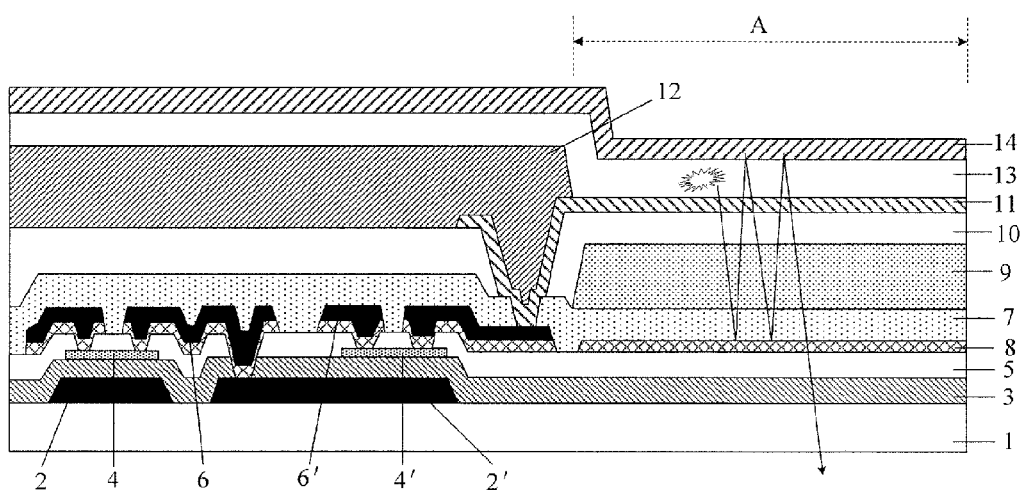
FIG. 5 is a structural schematic diagram illustrating an array substrate according to an embodiment of the invention.

An array substrate according to an embodiment of the invention comprises: a plurality of gate lines, a plurality of data lines and a plurality of pixel units formed by the plurality of gate lines and the plurality of data lines intersecting with each other on a base substrate 1. FIG. 5 is a structural schematic diagram illustrating the array substrate according to the embodiment of the invention, in which only one pixel unit is shown as an example. As illustrated in FIG. 5, each pixel unit comprises: a thin-film transistor region and a display region A other than the thin-film transistor region. A thin-film transistor structure is formed in the thin-film transistor region, and an organic light-emitting diode driven by the thin-film transistor structure is formed in the display region A. Each pixel unit further comprises a color filter film 9 disposed in the display region A of the pixel unit. The organic light-emitting diode comprises a transparent first electrode 11, a light-emitting layer 13, and a second electrode 14 for reflecting light that are sequentially formed in a direction away from the base substrate 1.

In order to achieve a microcavity structure, the pixel unit of the array substrate further comprises a transflective layer 8. The transflective layer 8 is disposed in the display region A of the pixel unit. The color filter film 9 is disposed between the second electrode 14 of the organic light-emitting diode and the transflective layer 8. The color filter films 9 in the pixel units of different colors have different thicknesses. A portion of the transflective layer 8 may be disposed in a source-drain electrodes region of the thin-film transistor structure (in the case that the portion of the transflective layer 8 is disposed in the sour-drain region, the transflective layer 8 may be formed by a same patterning process as the source and drain electrodes). The second electrode 14 of the organic light-emitting diode and the transflective layer 8 form a microcavity structure. The color filter film 9 is disposed inside the microcavity structure, and specifically, it is disposed between the second electrode 14 of the organic light-emitting diode and the transflective layer 8. Since the color filter films 9 in the pixel units of different colors have different thicknesses, the thicknesses of the microcavity structures in the pixel units of different colors can be adjusted by controlling the thicknesses of the color filter films 9 in the pixel units of different colors. Because the color filter films in the pixel units of different colors are formed in different steps, their thickness can easily be controlled respectively. Accordingly, it is unnecessary to respectively produce additional layers for pixel units of different colors so that the pixel units of different colors have the microcavity structures of different thicknesses. As a result, the fabrication process of the array substrate according to the embodiment of the invention can be simplified and the cost can be reduced.

As shown in FIG. 5, the thin-film transistor structure in the thin-film transistor region comprises: a first gate electrode 2 and a second gate electrode 2' formed on the base substrate 1; a gate insulating layer 3 formed on the first gate electrode 2 and the second gate electrode 2': a first active layer 4 and a second active layer 4' formed on the gate insulating layer 3; an insulating layer 5 formed on the first active layer 4 and the second active layer 4'; a first source-drain electrodes layer 6 (including a first source electrode and a first drain electrode) and a second source-drain electrodes layer 6' (including a second source electrode and a second drain electrode) formed on the insulating layer 5. The first gate electrode 2, the gate insulating layer 3, the first active layer 4, the insulating layer 5 and the first source-drain electrodes layer 6 form a switching thin-film transistor. The second gate electrode 2', the gate insulating layer 3, the second active layer 4', the insulating layer 5 and the second source-drain electrodes layer 6' form a driving thin-film transistor. The first drain electrode is connected with the second gate electrode, and the second drain electrode of the driving thin-film transistor is connected with the first electrode of the organic light light-emitting diode.

A passivation layer 7 is formed on the thin-film transistor structure, and specifically, the passivation layer 7 is formed on the first source-drain electrodes layer 6 and the second source-drain electrodes layer 6'. Depending on the fabrication processes, the portion of the transflective layer may be under the first source-drain electrodes layer 6 and the second source-drain electrodes layer 6', and a pattern of the portion of the transflective layer is same as patterns of the first source-drain electrodes layer 6 and the second source-drain electrodes layer 6'. When the portion of the transflective layer is disposed under the first source-drain electrodes layer 6 and the second source-drain electrodes layer 6', the transflective layer is required to be made of conductive material.

In addition, the insulating layer 5 and the passivation layer 7 in the thin-film transistor region are further formed in the display region A. The organic light-emitting diode is formed above the passivation layer 7, and the first electrode 11 is connected to the second drain electrode through a via hole of the passivation layer 7.

The transflective layer 8 is formed between the insulating layer 5 and the passivation layer 7, the color filter film 9 is formed on the passivation layer 7, and the first electrode 11 of the organic light-emitting diode is fainted on the color filter film 9. The organic light-emitting diode is disposed above the transflective layer 8 and the color filter film 9, and is defined in the display region A by a pixel define layer (PDL) 12. In addition, the first electrode 11 is an anode, the second electrode 14 is a cathode (alternatively, the first electrode 11 is the cathode, and the second electrode 14 is the anode), and the first electrode 11 is connected to the second drain electrode through the via hole of the passivation layer 7. The second electrode 14 may be a reflecting electrode made of a reflective material, or the second electrode 14 is coated with a reflecting layer to form the reflecting electrode.

As for the switching thin-film transistor, the gate electrode (the first gate electrode 2) thereof is connected to the gate line, the source electrode (the first source electrode) thereof is connected to the data line, and the drain electrode (the first drain electrode) thereof is connected to the gate electrode (the second gate electrode 2') of the driving thin-film transistor. As for the driving thin-film transistor, the source electrode (the second source electrode) thereof is connected to a power supply voltage, and the drain electrode (the second drain electrode) thereof is connected to the first electrode 11 of the organic light-emitting diode. The white light from the organic light-emitting layer 13 exits from the base substrate 1 after transmitting through the first electrode 11 and the respective layers under the first electrode 11, as shown in FIG. 5. When the white light from the organic light-emitting layer 13 irradiates on the transflective layer 8, a portion of the white light transmits and the other portion of the white light is reflected. Such reflected light is further reflected by the second electrode 14. In the process that the reflected light is repeatedly reflected between the transflective layer 8 and the second electrode 14, the light having a wavelength corresponding to the color of the pixel unit among the light ultimately emitted from the transflective layer 8 will be enhanced due to the resonance effect, so that the brightness of the resultant OLED display device is increased.

In order to increase the thickness of the microcavity structure and to further increase the brightness, a resin layer 10 is further formed between the color filter film 9 and the first electrode 11. In this case, the first electrode 11 is connected to the second drain electrode through a via hole that extending through the passivation layer 7 and the resin layer 10.

For example, the transflective layer 8 is to led of any one of silver, aluminum, molybdenum, copper, titanium and chromium, or an alloy of two or more of the foregoing metals. For example, the transflective layer 8 has a transmittance of 5%~95% and a thickness of 10 Å~200 Å. For example, the color filter film 9 has a thickness of 1000 Å~40000 Å. The color filter films 9 in the pixel units of different colors may be red, green and blue; or red, green, blue and yellow; or red, green, blue and white.

An embodiment of the invention further provides a method of fabricating an array substrate. The method may comprise the following steps.

Step 1: forming a thin-film transistor structure, a transflective layer 8 and a passivation layer 7 on a base substrate 1.

Figure 6:
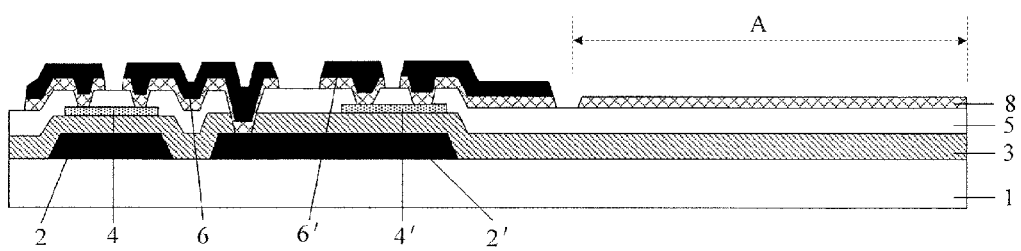
FIG. 6 is a schematic diagram illustrating forming a thin-film transistor structure and a transflective layer on a substrate in an array substrate fabrication method according to an embodiment of the invention.

As shown in FIG. 6, gate electrodes (a first gate electrode 2 and a second gate electrode 2'), a gate insulating layer, active layers (a first active layer 4 and a second active layer 4'), an insulating layer 5 and a via hole in the insulating layer 5 are formed on the base substrate.

Next, a transflective film and a source-drain metal film are formed, and the transflective layer 8 and the source-drain electrodes (a first source-drain electrodes layer 6 and a second source-drain electrodes layer 6') of the thin-film transistor structure are formed by a single patterning process (the patterning process generally comprises photoresist coating, exposure, development, etching, photoresist stripping and the like). For example, the transflective film is formed of any one of silver, aluminum, molybdenum, copper, titanium and chromium, or an alloy of two or more of the foregoing metals. For example, the transflective film has a transmittance of 5%~95% and a thickness of 10 Å~200 Å. Since the transflective layer 8, the first source-drain electrodes layer 6 and the second source-drain electrodes layer 6' are formed simultaneously by a single patterning process, a portion of the transflective layer is provided under the first source-drain electrodes layer 6 and the second source-drain electrodes layer 6', and a pattern of the portion of the transflective layer is same as patterns of the first source-drain electrodes layer 6 and the second source-drain electrodes layer 6'. The resultant structure is shown in FIG. 6, in which one pixel unit is illustrated as an example. As shown in FIG. 6, a region in which the thin-film transistor structure is provided is a thin-film transistor region, and a region other than the thin-film transistor region is a display region A. The thin-film transistor structure comprises a switching thin-film transistor and a driving thin-film transistor. The first gate electrode 2, the gate insulating layer 3, the first active layer 4, the insulating layer 5 and the first source-drain electrodes layer 6 (including a first source electrode and first drain electrode) form the switching thin-film transistor. The second gate electrode 2', the gate insulating layer 3, the second active layer 4', the insulating layer 5 and the second source-drain electrodes layer 6' (including a second source electrode and second drain electrode) form the driving thin-film transistor.

Figure 7:
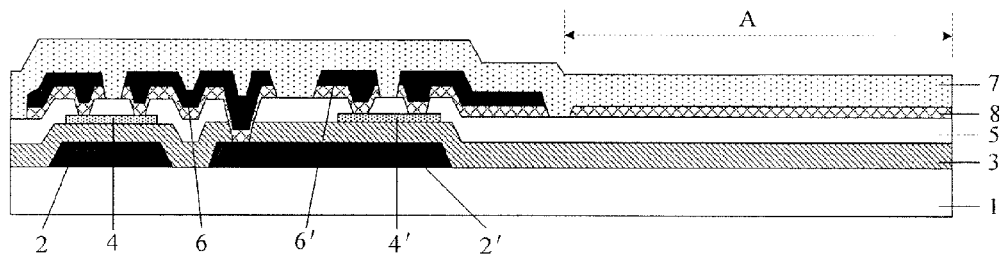
FIG. 7 is a schematic diagram illustrating forming a passivation layer in the array substrate fabrication method according to the embodiment of the invention.
Figure 8:
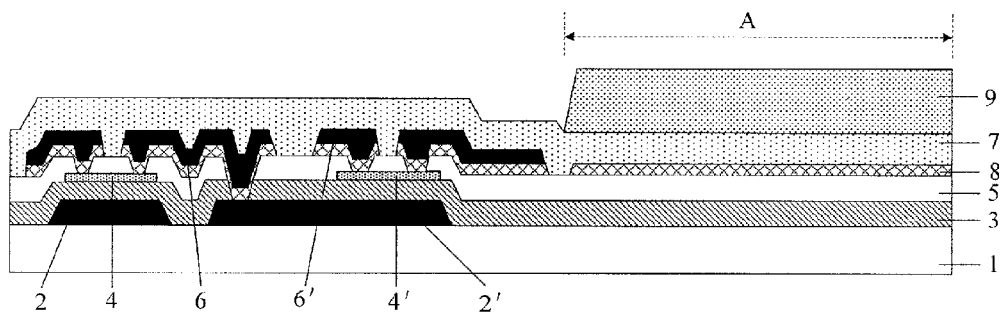
FIG. 8 is a schematic diagram illustrating forming a color filter film in the array substrate fabrication method according to the embodiment of the invention.

Then, the passivation layer 7 is formed. The substrate after the passivation layer 7 is formed is shown in FIG. 7.

Step 2: forming a color filter film 9 in the display region A of each pixel unit so that the color filter films 9 in the pixel units of different colors have different thicknesses. For example, the step is performed as follows.

The color filter films 9 are formed by multiple patterning processes and each patterning process forms the color filter film in the pixel unit of one color, so that the color filter films in the pixel units of different colors have different thicknesses. For example, the array substrate has the pixel units of three colors of R, G, and B. In this case, the color filter films 9 may be formed by three patterning processes, and the color filter films 9 in the pixel units of RGB three colors have different thicknesses. For example, the color filter film 9 in the red pixel unit is formed by a first patterning process, the color filter film 9 in the green pixel unit is formed by a second patterning process, and the color filter film 9 in the blue pixel unit is formed by a third patterning process, and the color filter film 9 in the red pixel unit, the color filter film 9 in the green pixel unit and the color filter film 9 in the blue pixel unit have thicknesses different from one another. For example, the color filter film 9 has a thickness of 1000 Å~40000 Å. The above-described thickness range of the color filter film is large and the color filter film is provided inside the microcavity structure, thus the thicknesses of the microcavity structures in the pixel units of different colors can be adjusted by controlling the thicknesses of the color filter films 9 in the pixel units of different colors so that the microcavity structures in the pixel units of different colors can enhance the lights of the pixel units of different colors. Because the color filter films in the pixel units of different colors are formed in different steps, their thickness can easily be controlled respectively. Accordingly, it is unnecessary to respectively produce additional layers for pixel units of different colors so that the pixel units of different colors have the microcavity structures of different thicknesses. As a result, the fabrication process of the array substrate according to the embodiment of the invention can be simplified and the cost can be reduced.

Step 3: forming an organic light-emitting diode in the display region A of each pixel unit, so that the color filter film 9 is formed between the organic light-emitting diode and the transflective layer 8.

Figure 9:
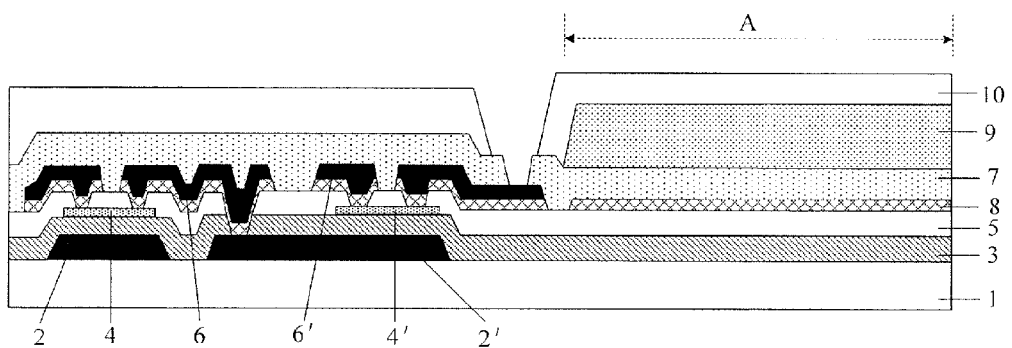
FIG. 9 is a schematic diagram illustrating forming a resin layer in the array substrate fabrication method according to the embodiment of the invention.

As shown in FIG. 9, a via hole of the passivation layer 7 is formed by a patterning process. In order to increase the thickness of the microcavity structure and to further increase the brightness, a resin layer 10 is further formed on the passivation layer 7. In this case, the via hole extends through the passivation layer 7 and the resin layer 10.

Figure 10:
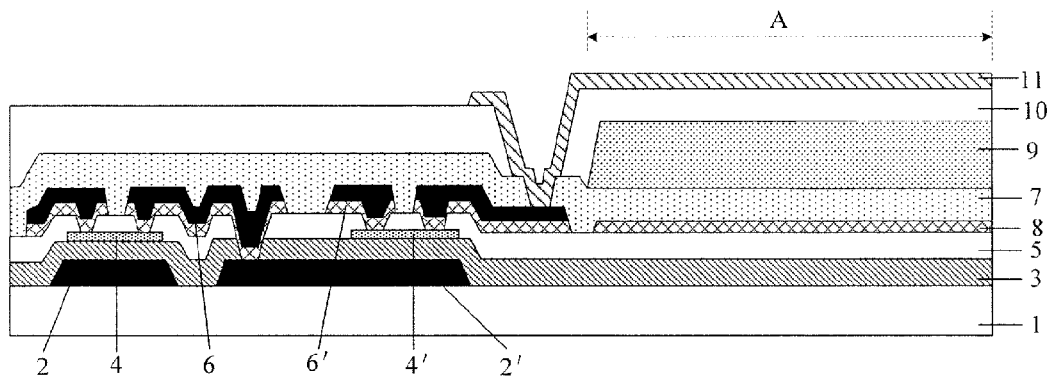
FIG. 10 is a schematic diagram illustrating forming an anode in the array substrate fabrication method according to the embodiment of the invention.

As shown in FIG. 10, a transparent conductive film is formed, and a first electrode 11 of the organic light-emitting diode is formed by a patterning process on the transparent conductive film. The first electrode 11 is connected to the thin-film transistor structure through the via hole, and specifically, the first electrode 11 is connected to the drain electrode of the driving thin-film transistor through the via hole.

Figure 11:
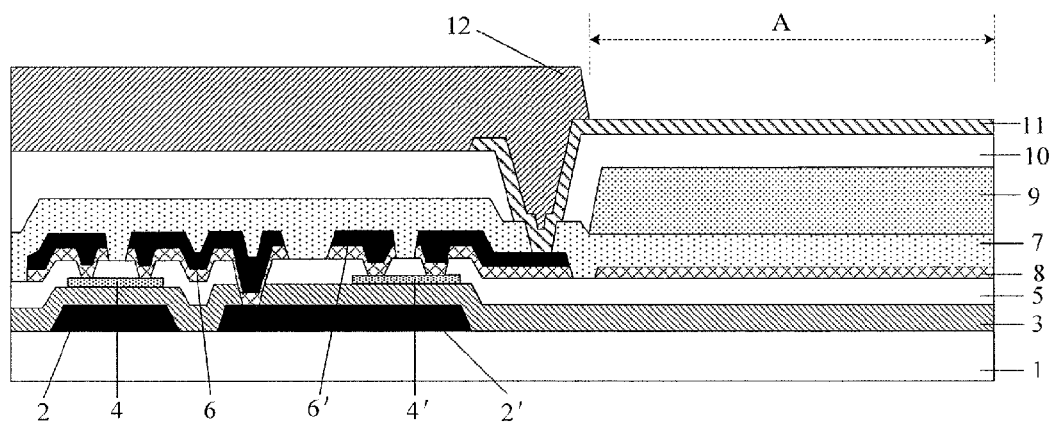
FIG. 11 is a schematic diagram illustrating forming a pixel define layer in the array substrate fabrication method according to the embodiment of the invention.

As shown in FIG. 11, an insulating film is formed and a pixel define layer 12 is formed by a patterning process on the insulating film, so that the organic light-emitting diode to be formed is defined in the display region A;

An organic light-emitting layer 13 and a second electrode 14 are formed so that the organic light-emitting diode is formed. The resultant array substrate is shown in FIG. 5. The second electrode 14 is a reflecting electrode, and it may be made of a reflective material. Alternatively, a reflecting layer is formed before the formation of the second electrode 14, and the second electrode 14 is then formed on the reflecting layer. Alternatively, the second electrode 14 is first formed and then a reflecting layer is formed on the second electrode 14.

An embodiment of the invention further provides a display device, and the display device comprises the above array substrate. The display device may be any product or component having a display function such as an e-paper, an OLED panel, an OLED display, an OLED television, a digital photo frame, a mobile phone, a pad and the like.

The foregoing embodiments merely are exemplary embodiments of the invention, and not intended to define the scope of the invention, and the scope of the invention is determined by the appended claims.

What is claimed is:

1. An array substrate, comprising a plurality of pixel units disposed on a base substrate,
wherein the pixel unit comprises:
a thin-film transistor structure formed on the base substrate;
an organic light-emitting diode driven by the thin-film transistor structure and disposed in a display region of the pixel unit, wherein the organic light-emitting diode comprises a transparent first electrode, a light-emitting layer, and a second electrode for reflecting light that are sequentially formed in a direction away from the base substrate;
a transflective layer formed between the organic light-emitting diode and the thin-film transistor structure;
a color filter film formed between the second electrode of the organic light-emitting diode and the transflective layer, wherein the color filter films in the pixel units of different colors have different thicknesses; and
a microcavity structure formed by the second electrode of the organic light-emitting diode and the transflective layer;
wherein the thin-film transistor structure comprises: a first gate electrode and a second gate electrode formed on the base substrate; a gate insulating layer formed on the first gate electrode and the second gate electrode; a first active layer and a second active layer formed on the gate insulating layer; a first source electrode and a first drain electrode formed on the first active layer, and a second source electrode and a second drain electrode formed on the second active layer;
wherein the transflective layer is formed in the display region of the pixel unit and a source-drain electrodes region of the thin-film transistor structure; and
wherein portions of the transflective layer in the source-drain electrodes region of the thin-film transistor structure are respectively formed below the first source electrode, the first drain electrode, the second source electrode and the second drain electrode of the thin-film transistor structure, and patterns of the portions of the transflective layer are same as patterns of the first source electrode, the first drain electrode, the second source electrode and the second drain electrode.

2. The array substrate according to claim 1, wherein the first drain electrode is connected to the second gate electrode; the first gate electrode, the gate insulating layer, the first active layer, the first source electrode and the first drain electrode form a switching thin-film transistor; the second gate electrode, the gate insulating layer, the second active layer, the second source electrode and the second drain electrode form a driving thin-film transistor; and the second drain electrode of the driving thin-film transistor is connected to the first electrode of the organic light-emitting diode.

3. The array substrate according to claim 2, wherein
a passivation layer is formed on the thin-film transistor structure;
the organic light-emitting diode is formed above the passivation layer, the second electrode of the light-emitting diode is a cathode, the first electrode of the light-emitting diode is an anode, the anode is connected to the second drain electrode through a via hole in the passivation layer;
the transflective layer is formed between the thin-film transistor structure and the passivation layer;
the color filter film is formed on the passivation layer, and the color filter film is formed in the display region of the pixel unit; and
the anode of the organic light-emitting diode is disposed above the color filter film.

4. The array substrate according to claim 2, wherein
a passivation layer is formed on the thin-film transistor structure;
the organic light-emitting diode is formed above the passivation layer, the first electrode of the light-emitting diode is a cathode, the second electrode of the light-emitting diode is an anode, the cathode is connected to the second drain electrode through a via hole in the passivation layer;
the transflective layer is formed between the thin-film transistor structure and the passivation layer;
the color filter film is formed on the passivation layer, and the color filter film is formed in the display region of the pixel unit; and
the cathode of the organic light-emitting diode is disposed above the color filter film.

5. The array substrate according to claim 3, wherein
a resin layer is further formed between the color filter film and the first electrode, and the first electrode is connected to the second drain electrode through a via hole passing through the resin layer and the passivation layer.

6. The array substrate according to claim 4, wherein
a resin layer is further formed between the color filter film and the first electrode, and the first electrode is connected to the second drain electrode through a via hole passing through the resin layer and the passivation layer.

7. The array substrate according to claim 1, wherein
in a region of the pixel unit corresponding to the thin-film transistor structure, a pixel define layer is disposed on the first electrode so as to define the organic light-emitting diode in the display region.

8. The array substrate according to claim 1, wherein
the transflective layer is formed of any one of silver, aluminum, molybdenum, copper, titanium and chromium, or an alloy of two or more of the foregoing metals, and the transflective layer has a transmittance of 5%~95%;
the transflective layer has a thickness of 10 Å~200 Å; and
the color filter film has a thickness of 1000 Å~40000 Å.

9. The array substrate according to claim 1, wherein the color filter films in the pixel units of different colors are red, green and blue; or red, green, blue and yellow; or red, green, blue and white.

10. A display device, wherein the display device comprises the array substrate according to claim 1.

* * * * *